(12) United States Patent
Shih et al.

(10) Patent No.: US 7,763,935 B2
(45) Date of Patent: Jul. 27, 2010

(54) ONO FORMATION OF SEMICONDUCTOR MEMORY DEVICE AND METHOD OF FABRICATING THE SAME

(75) Inventors: Yen-Hao Shih, Changhua (TW); Shih-Chin Lee, Siling Township, Yunlin County (TW); Jung-Yu Hsieh, Hsinchu (TW); Erh-Kun Lai, Taichung (TW); Kuang-Yeu Hsieh, Jubei (TW)

(73) Assignee: Macronix International Co., Ltd., Hsinchu (TW)

( * ) Notice: Subject to any disclaimer, the term of this patent is extended or adjusted under 35 U.S.C. 154(b) by 427 days.

(21) Appl. No.: 11/159,269

(22) Filed: Jun. 23, 2005

(65) Prior Publication Data

US 2006/0292800 A1 Dec. 28, 2006

(51) Int. Cl.
*H01L 21/336* (2006.01)
(52) U.S. Cl. .............. 257/324; 257/314; 257/E29.309; 438/262; 438/263; 438/264
(58) Field of Classification Search ................ 438/266, 438/257, 258, 551, 593, 594, 680, 663, 706, 438/745, 770, 773, 954, 261; 257/E29.309, 257/E21.21, E21.423, E21.679
See application file for complete search history.

(56) References Cited

U.S. PATENT DOCUMENTS

| 5,619,063 | A  | * | 4/1997  | Chen et al. ................... 257/530 |
| 5,836,772 | A  | * | 11/1998 | Chang et al. ................. 438/261 |
| 6,133,095 | A  | * | 10/2000 | Eitan et al. ................... 438/261 |
| 6,228,782 | B1 | * | 5/2001  | Fang et al. ................... 438/400 |
| 6,297,096 | B1 | * | 10/2001 | Boaz ........................... 438/261 |
| 6,440,797 | B1 | * | 8/2002  | Wu et al. ...................... 438/261 |
| 7,341,956 | B1 | * | 3/2008  | Tokuno et al. ............... 438/717 |
| 2002/0132416 | A1 | * | 9/2002  | Gamo et al. ................. 438/216 |
| 2007/0054449 | A1 | * | 3/2007  | Shih et al. ................... 438/257 |

* cited by examiner

*Primary Examiner*—Kiesha R Bryant
*Assistant Examiner*—Eric Ward
(74) *Attorney, Agent, or Firm*—Rabin & Berdo, PC

(57) ABSTRACT

A method of fabricating a non-volatile memory device at least comprises steps as follows. First, a substrate on which a bottom dielectric layer is formed is provided. Then, impurities are introduced through the bottom dielectric layer to the substrate, so as to form a plurality of spaced doped regions on the substrate. The structure is thermally annealed for pushing the spaced doped regions to diffuse outwardly. After annealing, a charge trapping layer is formed on the bottom dielectric layer, and a top dielectric layer is formed on the charge trapping layer. Finally, a gate structure (such as a polysilicon layer and a silicide) is formed on the top dielectric layer.

9 Claims, 4 Drawing Sheets

US 7,763,935 B2

ONO FORMATION OF SEMICONDUCTOR MEMORY DEVICE AND METHOD OF FABRICATING THE SAME

BACKGROUND OF THE INVENTION

1. Field of the Invention

The invention relates in general to an ONO formation of semiconductor memory device and method of fabricating the same, and more particularly to the method of forming the ONO and bit lines of semiconductor memory device.

2. Description of the Related Art

Non-volatile memory devices have been widely used in the electronic products. The memory device is programmed by inducing hot electrons injection from the substrate to the ONO dielectric. The ONO dielectric generally has a silicon nitride layer sandwiched between a bottom oxide layer and a top oxide layer. The silicon nitride layer provides a charge trapping mechanism for programming the memory cell. Many researches about ONO formation of non-volatile memory device have been published in the recent years.

Referring to FIG. 1A~1D, a conventional method of forming the ONO dielectric and bit lines of the non-volatile memory device is illustrated. This conventional method is disclosed in U.S. Pat. No. 6,436,768 to Yang et al. First, a substrate 10 on which a bottom oxide layer 11 and silicon nitride layer 12 are deposited is provided, as shown in FIG. 1A. Then, a patterned photoresist (PR) is formed above the silicon nitride layer to expose the doped regions, as shown in FIG. 1B. After the PR layer is patterned, ions are implanted into the substrate 10, as shown by the arrows, forming the doped regions 101 of FIG. 1C. The implantation is conducted to achieve a suitable dosage. The doped regions 101 functions as the bit lines of the memory device. The semiconductor structure is annealed at a suitable temperature after implantation. After annealing, a top oxide layer 16 is formed on the silicon nitride layer 12 for completing the formation of ONO dielectric, as shown in FIG. 1D.

However, the method described by Yang et al. requires a high concentration and high energy of dosage during ion implantation. Examples of implanted dosage includes a range from about $1 \times 10^{14}$ to about $1 \times 10^{16}$ atoms/cm$^2$, a range from about $5 \times 10^{14}$ to about $7 \times 10^{15}$ atoms/cm$^2$, and a range from about $1 \times 10^{15}$ to about $5 \times 10^{15}$ atoms/cm$^2$. The implant energy can be as high as 100 keV. Unfortunately, the ion implantation through the NO (i.e. nitride-oxide) stack damages the silicon nitride layer and the bottom oxide layer, thereby causing the interface traps between the bottom oxide layer and the silicon nitride layer. Also, the ions rebounded from the doped regions could randomly impact the bottom oxide layer during implantation, resulting in a severer damage to the bottom oxide layer and leading to charge loss through the bottom oxide layer. Although the annealing process is performed after implantation and most portion of silicon nitride layer and the bottom oxide have been repaired, the interface traps are hardly recovered (since oxygen is hardly penetrate the bottom oxide layer through the silicon nitride layer).

FIG. 2A~2D illustrate a cross-sectional view of another conventional method of forming the ONO dielectric and bit lines of the non-volatile memory device. This conventional method is disclosed in U.S. Pat. No. 6,803,279 to Eitan et al. First, a substrate 20 on which a bottom oxide layer 21, silicon nitride layer 22 and a top oxide layer 23 are formed is provided, as shown in FIG. 2A. Then, a patterned photoresist (PR) 24 is formed above the top oxide layer 23 to expose the doped regions, as shown in FIG. 2B. Before implanting the bit lines, at least the top oxide layer 23 and the silicon nitride layer 22 are etched according to the patterned PR 24, for the purpose of decreasing the energy of implanted dosage. In FIG. 2C, the top oxide layer 23, the silicon nitride layer 22 and the bottom oxide layer 21 uncovered by the patterned PR 24 are etched away. Then, ions are implanted into the substrate, as shown by the arrows, forming the doped regions 201 of FIG. 2C. The doped regions 201 functions as the bit lines of the memory device. After implantation, the patterned PR 24 is removed and BD (i.e. formed about the bit lines) oxides 25 are then thermally grown in an oxidation operation. The BD oxides 25 are typically very thick, as shown in FIG. 2D.

According to the method disclosed by Eitan et al., bit line formation is performed after ONO dielectric is opened; thus, the ion implantation can still cause serve damage to the bottom oxide layer, thereby leading the charge loss of the memory device. ONO dielectric breakdown is easily occurred at the junctions between the BD oxides and the adjacent ONO stacks. Also, hydrogen can penetrate the interface between the bottom oxide layer and silicon nitride layer through the BD oxides, causing a bad retention performance of memory device.

SUMMARY OF THE INVENTION

It is therefore an object of the invention to provide an ONO formation of semiconductor memory device and method of fabricating the same. By applying the method of the invention, the memory device possesses good bottom oxide and clear interfaces between each layer of the ONO dielectric. Also, the nitride blocks the hydrogen penetration, so as to improve the long-term functionality and increase the device longevity.

The invention achieves the objects by providing a method of fabricating a non-volatile memory device, at least comprising steps of:

providing a substrate on which a bottom dielectric layer is formed;

introducing impurities through the bottom dielectric layer to the substrate, so as to form a plurality of spaced doped regions on the substrate;

pushing the spaced doped regions to diffuse outwardly;

forming a charge trapping layer on the bottom dielectric layer;

forming a top dielectric layer on the charge trapping layer; and forming a gate structure on the top dielectric layer.

The invention achieves the objects by providing a method of fabricating a non-volatile memory device, at least comprising steps of:

forming a bottom dielectric layer on a substrate;

forming a plurality of spaced doped regions on the substrate by ion implanting;

subjecting the substrate and the bottom dielectric layer to a first annealing process;

diffusing the spaced doped regions by subjecting the substrate and the bottom dielectric layer to a second annealing process;

forming a charge trapping layer on the bottom dielectric layer;

forming a top dielectric layer on the charge trapping layer; and forming a gate structure on the top dielectric layer.

The invention achieves the objects by providing a semiconductor structure, at least comprising a substrate; a plurality of buried diffusion (BD) regions formed in the substrate, and the two adjacent BD regions spaced a channel region apart; an ONO dielectric formed on the substrate; and a gate structure formed on the ONO dielectric. The ONO dielectric comprises a first ONO dielectric group having a first thickness formed above the BD regions, and a second ONO dielectric group having a second thickness formed above the channel regions. The first thickness of the first ONO dielectric group is equal or less than the second thickness of the second ONO dielectric group.

The invention achieves the objects by providing a semiconductor structure, at least comprising a substrate; a plurality of buried diffusion (BD) regions formed in the substrate, and the two adjacent BD regions spaced a channel region apart; an ONO dielectric including a bottom oxide (BOX) layer, a nitride layer and a top oxide (TOX) layer laminated on the substrate; and a gate structure formed on the ONO dielectric. The ONO dielectric comprises: a first ONO dielectric group, having a first thickness and formed above the BD regions; and a second ONO dielectric group, having a second thickness and formed above the channel regions, wherein an interface between the BOX layer and nitride layer, and an interface between the TOX layer and nitride layer are clearly presented in the first and second ONO dielectric groups.

Other objects, features, and advantages of the invention will become apparent from the following detailed description of the preferred but non-limiting embodiment. The following description is made with reference to the accompanying drawings.

DETAILED DESCRIPTION OF THE INVENTION

In the present invention, a method of fabricating the semiconductor memory device and method is provided. By applying the method of the invention, the memory device possesses good bottom oxide and clear interfaces between each layer of the ONO dielectric. Also, the nitride blocks the hydrogen penetration, so as to improve the long-term functionality and increase the device longevity.

A preferred embodiment disclosed herein is used for illustrating the invention, but not for limiting the scope of the invention. Additionally, the drawings used for illustrating the embodiment of the invention only show the major characteristic parts in order to avoid obscuring the invention. Accordingly, the specification and the drawings are to be regard as an illustrative sense rather than a restrictive sense.

Figure 1A:
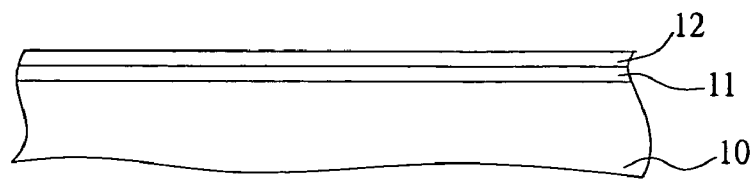
FIG. 1A~1D (prior art) illustrate a cross-sectional view of a conventional method of forming the ONO dielectric and bit lines of the non-volatile memory device.
Figure 1B:
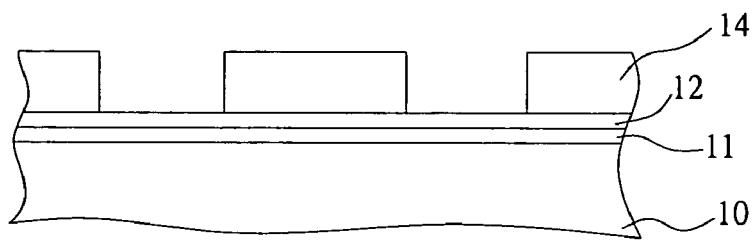
Figure 1C:
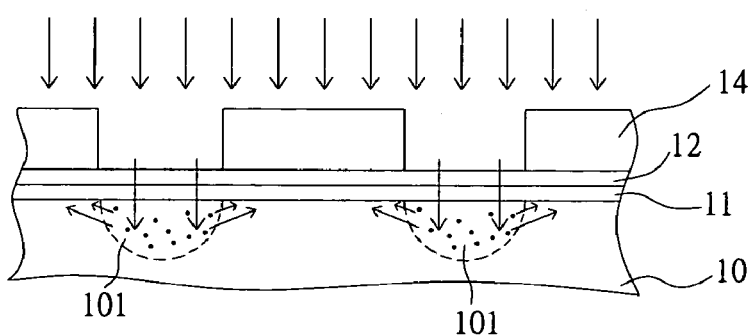
Figure 1D:
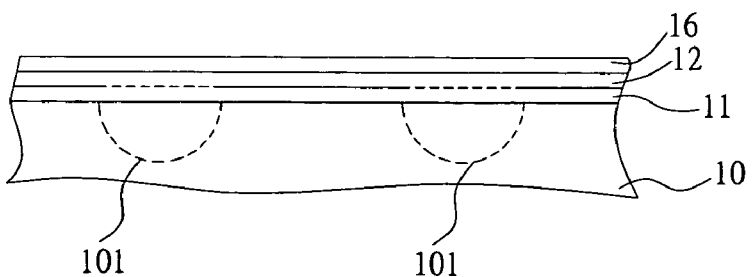
Figure 2A:
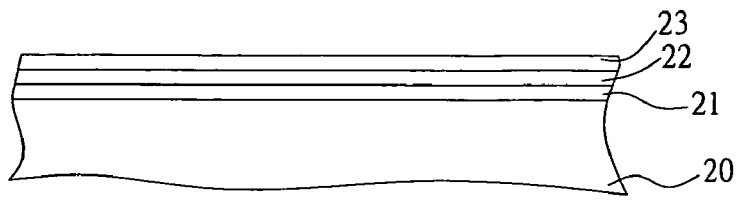
FIG. 2A~2D (prior art) illustrate a cross-sectional view of another conventional method of forming the ONO dielectric and bit lines of the non-volatile memory device.
Figure 2B:
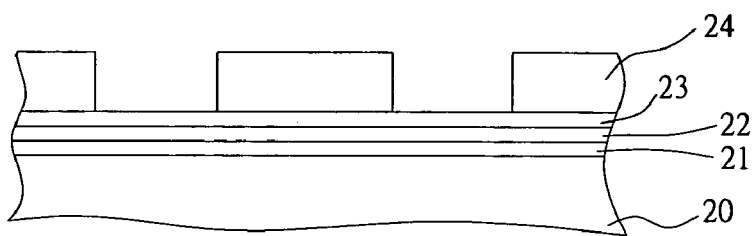
Figure 2C:
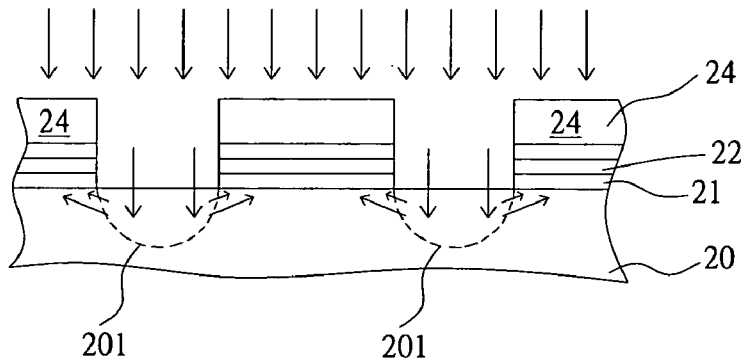
Figure 2D:
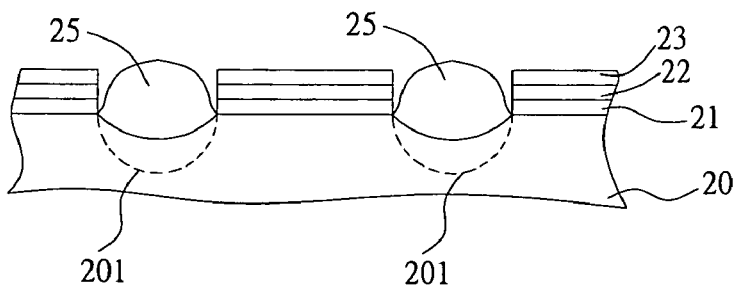
Figure 3A:
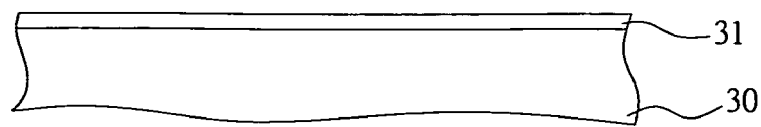
FIG. 3A~FIG. 3G illustrate a cross-sectional view of a method of forming the ONO dielectric and bit lines of the non-volatile memory device according to the embodiment of the invention.

FIG. 3A~FIG. 3G illustrate a cross-sectional view of a method of forming the ONO dielectric and bit lines of the non-volatile memory device according to the embodiment of the invention. First, a substrate 30 on which a bottom dielectric layer 31 is formed is provided, as shown in FIG. 3A. The bottom dielectric layer 31 is deposited on the substrate 30 in a dry-oxygen ambient. In a practical application, the substrate 30 could be a p-type substrate, doped with a p-type dopant by ion implantation of boron. The bottom dielectric layer 31 could be a bottom oxide (e.g. silicon oxide) layer, and grown over the substrate 30 in a dry ambient with post-oxidation annealing.

Figure 3B:
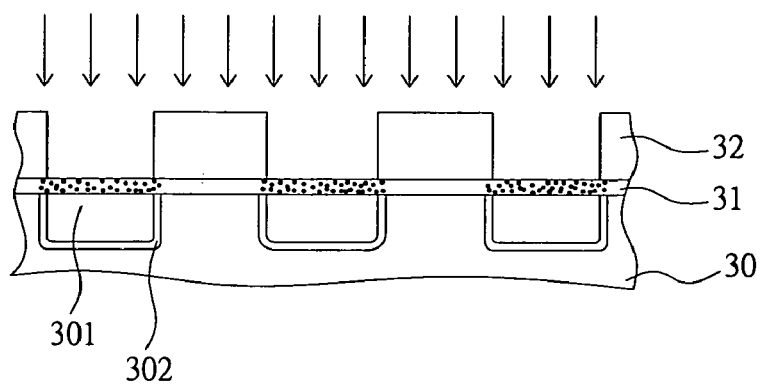
Figure 3C:
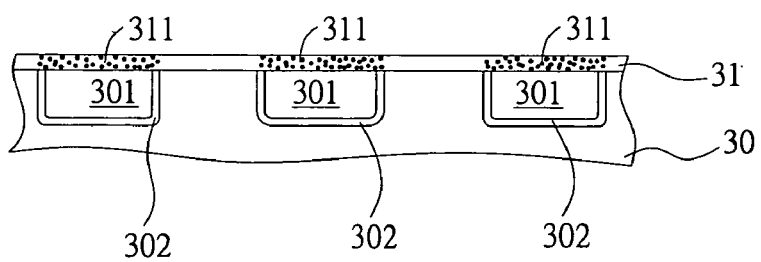

A photoresist (PR) layer is deposited and patterned to form a plurality of patterned photo-resist (PR) blocks 32 on the bottom dielectric layer 31, as shown in FIG. 3B. After the PR layer is patterned, impurities are introduced through the bottom dielectric layer 31 to the substrate 30, as shown by the arrows, so as to form a plurality of spaced doped regions on the substrate 30. In this embodiment, the spaced doped regions include the n-type regions 301 and the p-type pocket regions 302. The n-type regions 301 could be formed by ion implantation of an n-type dopant, such as arsenic, antimony, or phosphorus.

Figure 3D:
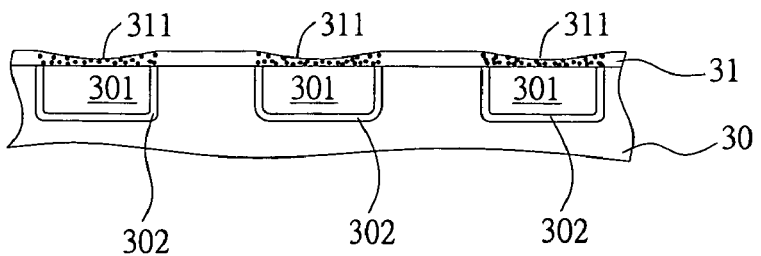

After spaced doped regions are formed in the substrate 30, the patterned PR blocks 32 are removed, as shown in FIG. 3D. It is noted that implantation causes the damaged areas 311 of the bottom dielectric layer 31. After patterned PR blocks 32 are removed, the semiconductor structure (including the substrate 30 and the bottom dielectric layer 31) is cleaned, for removing the metallic and organic residuals. The semiconductor structure is optionally treated by a rapid thermal annealing (RTA) process after cleaning, to reduce transient enhanced diffusion (TED). The RTA process is conducted at a temperature of about 900° C. to about 950° C. for about 30 seconds. After cleaning and RTA processes are done, loss of oxide layer may occur at the damaged areas 311 of the bottom dielectric layer 31, as shown in FIG. 3D. For example, if a bottom oxide layer (i.e. bottom dielectric layer 31) having a thickness of about 54 Å is originally grown on the substrate 30, 10 Å oxide could be lost after cleaning and RTA processes are done (i.e. the damaged areas 311 of the bottom oxide layer of FIG. 3D having a thickness of about 44 Å).

Figure 3E:
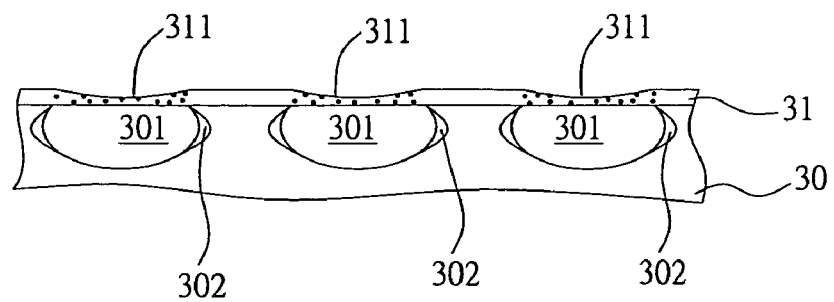

Next, a thermal annealing process is performed and the spaced doped regions (including the n-type regions 301 and the p-type pocket regions 302) are pushed to diffuse outwardly, as shown in FIG. 3E. In the practical step, the thermal annealing process could be conducted at a temperature ranged from about 800° C. to about 950° C. for at least about 5 minutes. Also, the thermal annealing process is conducted in an inert or non-oxidization ambient, such as gaseous ambient with nitrogen ($N_2$), argon (Ar), helium (He), or ammonia (NH3). After the thermal annealing process is done, the damaged areas 311 of the bottom dielectric layer 31 (caused by implantation) have been repaired, and the bottom dielectric layer 31 has a clear profile (i.e., has an observable boundary) at this point.

Figure 3F:
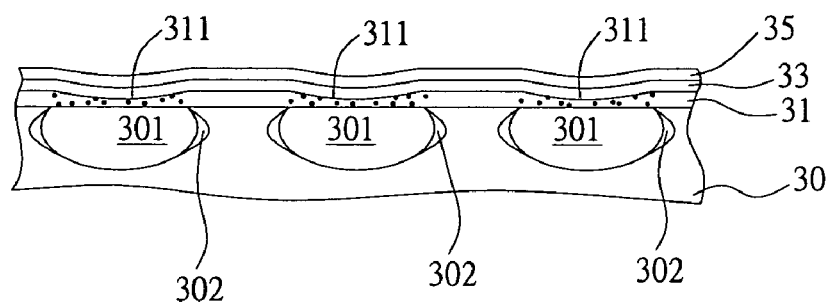

Once the thermal annealing process is done, a charge trapping layer 33 is formed on the bottom dielectric layer 31, and a top dielectric layer 35 is formed above the charge trapping layer 33, as shown in FIG. 3F. In the practical application, the charge trapping layer 33 could be a silicon nitride (SiN) layer, preferably formed by low pressure chemical vapor deposition (LPCVD). The top dielectric layer 35 could be a top oxide (e.g. silicon oxide) layer, preferably formed by low pressure chemical vapor and high thermal oxide deposition (LPCVD HTO). Also, the semiconductor structure is optionally subjected to a rapid thermal annealing (RTA) process to densify the ONO dielectric, particularly the top dielectric layer 35.

Figure 3G:
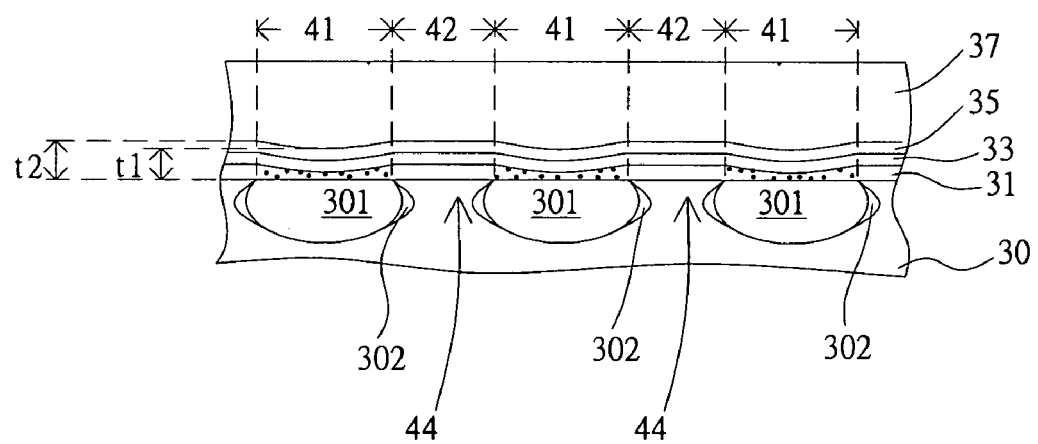

Also, a gate structure 37 is formed on the top dielectric layer, as shown in FIG. 3G. Practically, the gate structure 37 includes a polysilicon layer formed on the top dielectric layer 35, and a silicide layer formed on the polysilicon layer. Although not shown, prior or subsequent processes are performed to complete the fabrication of the memory device. For example, etch of peripheral ONO dielectric, growth of peripheral gate oxide, and so on.

In a practical application, the semiconductor structure, fabricated according to the embodiment described above, includes several buried diffusion (BD) regions (i.e. the n-type regions 301 and the p-type pocket regions 302) in the substrate 30, an ONO (i.e. bottom oxide/silicon nitride/top oxide) dielectric formed above the substrate 31 and a gate structure 37 formed on the ONO dielectric. As illustrated in FIG. 3G, the ONO dielectric comprises the first ONO dielectric group 41 and the second ONO dielectric group 42, respectively formed above the BD regions and the channel regions 44. Generally, two adjacent BD regions are spaced by a channel region 44 apart. The first ONO dielectric group 41 has a first thickness $t_1$ and the second ONO dielectric group 42 has a second thickness $t_2$. Since the bottom oxide is damaged due to the ion implantation, removing PR and clean process for the following thermal annealing process causes the oxide loss (regions 311 of FIG. 3E). If the semiconductor structure is examined cross-sectionally under the transmission electron microscopy (TEM), it is observed that the first thickness t1 of the first ONO dielectric group 41 is equal or less than the second thickness $t_2$ of the second ONO dielectric group 42. Also, it is observed that the interface between the bottom oxide layer and the silicon nitride layer of both the first ONO dielectric group 41 and the second bottom oxide layer 42 are clearly presented (i.e., the bottom oxide layer and silicon nitride layer have an observable boundary). Also, an interface between the top oxide layer and nitride layer of both the first ONO dielectric group 41 and the second bottom oxide layer 42 are clearly presented (i.e., the top oxide layer and silicon nitride layer have an observable boundary).

Forming buried diffusion lines (i.e. bit lines) by ion implantation usually degrades the bottom oxide, leading to charge loss, and is one of mechanisms for Vt loss in memory devices. According to the embodiment of the invention, the junctions are pushed into the implant damage-free zones in an inert/non-oxidization ambient (FIG. 3E), the structure of memory device possesses the clear nitride/oxide interface, clear oxide/silicon (i.e. substrate) interface and good bottom oxides.

Moreover, it is believed that hydrogen is responsible for high Vt loss in charge trapping memory devices at high temperatures. According to the embodiment of the invention, the bottom dielectric layer 31 preferably grown over the substrate 30 in dry oxidation possesses very low hydrogen content. After ion implantation, the charge trapping layer 33 and the top dielectric layer 35 are laminated in order above the bottom dielectric layer 31. Thus, the nitride can efficiently block hydrogen penetration and minimizes the impact of hydrogen on the memory device.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, at least comprising:
   a semiconductor substrate;
   a plurality of buried diffusion (BD) regions formed in the semiconductor substrate, including pairs of adjacent BD regions that are spaced a channel region apart;
   an ONO dielectric formed on the semiconductor substrate, the ONO dielectric comprising a first ONO dielectric group having a first thickness formed above the BD regions and a second ONO dielectric group having a second thickness formed above the channel regions; and
   a gate structure formed on the ONO dielectric,
   wherein the first thickness of the first ONO dielectric group is less than the second thickness of the second ONO dielectric group, and the thickness of a first bottom dielectric layer of the first ONO dielectric group is less than the thickness of a second bottom dielectric layer of the second ONO dielectric group, the first and second bottom dielectric layers respectively being the lowest layers of the first and second ONO dielectric groups, and
   wherein a bottom surface of the first bottom dielectric layer of the first ONO dielectric group and a bottom surface of the second bottom dielectric layer of the second ONO dielectric group contact a surface of the semiconductor substrate.

2. The structure according to claim 1, wherein the ONO dielectric includes a bottom oxide (BOX) layer, a silicon nitride (SiN) layer and a top oxide (TOX) layer laminated in this order on the semiconductor substrate, the BOX layer and SiN layer having an observable boundary in both the first ONO dielectric group and the second ONO dielectric group, the first and second bottom dielectric layers being the bottom oxide layer.

3. The structure according to claim 2, wherein the TOX layer and SiN layer have an observable boundary in both the first ONO dielectric group and the second ONO dielectric group.

4. The structure according to claim 1, wherein the gate structure comprises:
   a polysilicon layer, formed on the top dielectric layer; and
   a silicide layer, formed on the polysilicon layer.

5. A semiconductor structure, at least comprising:
   a semiconductor substrate;
   a plurality of buried diffusion (BD) regions formed in the semiconductor substrate, including pairs of adjacent BD regions that are spaced a channel region apart;
   an ONO dielectric including a bottom oxide (BOX) layer, a nitride layer and a top oxide (TOX) layer laminated in this order on the semiconductor substrate, the ONO dielectric further comprising:
      a first ONO dielectric group, having a concave surface and formed above the BD regions; and
      a second ONO dielectric group, having a flat surface and formed above the channel regions; and
   a gate structure formed on the ONO dielectric,
   wherein in the first ONO dielectric group, the BOX layer and nitride layer have an observable boundary, and the TOX layer and nitride layer have an observable boundary, and the thickness of a first bottom oxide layer of the first ONO dielectric group is less than the thickness of a second bottom oxide layer of the second ONO dielectric group, and
   wherein a bottom surface of the first bottom oxide layer of the first ONO dielectric group and a bottom surface of the second bottom oxide layer of the second ONO dielectric group form a flat plane.

6. The structure according to claim 5, wherein the first and second ONO dielectric groups respectively have a first thickness and a second thickness, and the first thickness of the first ONO dielectric group is less than the second thickness of the second ONO dielectric group.

7. The structure according to claim 5, wherein the gate structure comprises:
   a polysilicon layer, formed on the top dielectric layer; and
   a silicide layer, formed on the polysilicon layer.

8. The structure according to claim 1, wherein the bottom surfaces of the first and second bottom dielectric layers form a flat plane.

9. The structure according to claim 5, wherein the bottom surface of the first bottom oxide layer of the first ONO dielectric group and the bottom surface of the second bottom oxide layer of the second ONO dielectric group contact a surface of the semiconductor substrate.

* * * * *